United States Patent

Lachish et al.

[11] Patent Number: 6,011,264
[45] Date of Patent: Jan. 4, 2000

[54] APPARATUS, SYSTEM AND METHOD FOR GAMMA RAY AND X-RAY DETECTION

[75] Inventors: Uri Lachish, Rehovot; Alex Tsigelman, Petach Tikva; Uri El-Hanany, Rehovot, all of Israel

[73] Assignee: Urigal Technologies, Ltd., Rehovot, Israel

[21] Appl. No.: 08/750,926

[22] PCT Filed: Aug. 7, 1995

[86] PCT No.: PCT/US95/09965

§ 371 Date: Mar. 25, 1998

§ 102(e) Date: Mar. 25, 1998

[87] PCT Pub. No.: WO96/05521

PCT Pub. Date: Feb. 22, 1996

[30] Foreign Application Priority Data

Aug. 11, 1994 [IL] Israel ........................................ 110637

[51] Int. Cl.$^7$ ........................................................ G01T 1/22
[52] U.S. Cl. .................................... 250/370.13; 250/338.4
[58] Field of Search ............................. 250/370.13, 338.4

[56] References Cited

U.S. PATENT DOCUMENTS

| | | | |
|---|---|---|---|
| 3,999,071 | 12/1976 | Siffert et al. ........................ | 250/370.02 |
| 4,190,486 | 2/1980 | Kyle . | |
| 4,531,059 | 7/1985 | McCullough et al. ............. | 250/370.13 |
| 4,692,782 | 9/1987 | Seki et al. . | |
| 4,996,432 | 2/1991 | Saitou ................................ | 250/370.01 |
| 5,262,947 | 11/1993 | Boudan et al. . | |
| 5,315,506 | 5/1994 | Wang et al. . | |
| 5,391,882 | 2/1995 | Rhiger ................................ | 250/370.13 |

FOREIGN PATENT DOCUMENTS

| | | | |
|---|---|---|---|
| 55-101832 | 8/1980 | Japan ................................ | 250/370.13 |
| 63-14479 | 1/1988 | Japan . | |
| 3-248578 | 6/1991 | Japan . | |

OTHER PUBLICATIONS

E.N. Arkad'eva, et al., Possible Use of Cadmium Telluride For Detection of Pulsed X–Rays in Medical Tomography, Sov. Phys. Tech. Phys.26(9), Sep. 1981, pp. 1122–1125.

K. Zanio, et al., CdTe Detectors From Indium–Doped Tellurium–Rich Solutions, IEEE Trans. Nucl. Sci. NS21, 1974, pp. 315–321.

P. Hoschl, et al., Preparation of Cadmium Telluride Single Crystals for Nuclear Detectors, Czech. J. Phys. B., 1975, pp. 585–596a.

R.O. Bell, et al., Cadmium Telluride, Grown from Tellurium Solution, As A Material for Nuclear Radiation Detectors, Phys. Stat. Sol. (A), 1970, pp. 375–387.

Patent Abstracts of Japan, E Field, vol. 18, No. 406, issued Jul. 28, 1994; The Patent Office Japanese Government, p. 41 E 1585; & JP,A,06 120 549 (Shimaz Du Corp.).

A. Rose, Concepts in Photoconductivity and Allied Problems, Interscience Publishers, London, 1963, [section 8.3].

R.E. Braithwaite, et al., Solid State Electron, vol. 23, 1980, pp. 1091–1092.

E. Janik & R. Triboulet, OHMIC Contacts to P–Type Cadmium Telluride and Cadmium Mercury Telluride, J.Phys. D.: Appl. Phys., 16 (1983), pp. 2333–2340.

(List continued on next page.)

*Primary Examiner*—Constantine Hannaher
*Assistant Examiner*—Andrew Israel
*Attorney, Agent, or Firm*—Helfgott & Karas, PC.

[57] ABSTRACT

A method for determining X-ray, or gamma ray photon energy by, irradiating a high resistance n-type or p-type cadmium telluride alloy crystal with X-ray or gamma ray photons respectively providing first and second electrical contacts which are in electrical communication with the crystal, which are respectively negatively and positively biased and which provide free flow of electrons from the negatively biased contact to the crystal, and wherein holes, generated by absorption of photons in the crystal, recombine with the electrons, and determining the photon energy by measuring the amount of charge generated per photon absorbed be the crystal.

65 Claims, 2 Drawing Sheets

OTHER PUBLICATIONS

G.F. Knoll, Radiation Detection and Measurement, John Wiley and Sons, 2nd Edition, 1989, p. 349.

R.J. Fox, et al., Use of Guard–Ring Silicon Surface–Barrier Detectors in Beta Spectrometry, Rev. of Scientific Instruments, 1962, p. 757.

A. Breskin and R. Chechik, High Accuracy Imaging of Single Photoelectrons by Low–Pressure Multistep Avalanche Chamber . . . , Nucl. Inst. & Methods in Phys. Res. 227(1984), pp. 24–28.

Nanse R. Kyle, Growth of Semi–Insulating Cadmium Telluride, J. ElectroChem. Soc.: vol. 118, No. 11, 1971, pp. 1790–1797.

B. Biglari, et al., Evolution of Resistivity Along Cl–Compensated THM Grown Cadmium Telluride Crystals, Phys. Stat. Sol. (a) 100, 1987, pp. 589–596.

APPARATUS, SYSTEM AND METHOD FOR GAMMA RAY AND X-RAY DETECTION

FIELD OF THE INVENTION

The present invention relates to radiation detectors.

BACKGROUND OF THE INVENTION

Semiconductors as radiation detectors are discussed in G. F. Knoll, *Radiation Detection and Measurement*, John Wiley and Sons, Second Edition, 1989, pp. 349. Knoll defines an Ohmic contact as "a nonrectifying electrode through which charges of either sign can flow freely. If two Ohmic contacts are fitted on opposite faces of a slab of semiconductor and connected to a detection circuit, the equilibrium charge carrier concentrations in the semiconductor will be maintained. If an electron or hole is collected at one electrode, the same carrier species is injected at the opposite electrode to maintain the equilibrium concentrations in the semiconductor."

Regarding semiconductor diode detectors, Knoll states on page 350: "The steady-state leakage currents that are observed using Ohmic contacts are too high, even with the highest resistivity material available . . . . Instead, noninjecting or blocking electrodes are universally employed to reduce the magnitude of the current through the bulk of the semiconductor. If blocking electrodes are used, charge carriers initially removed by the application of an electric field are not replaced at the opposite electrode, and their overall concentration within the semiconductor will drop after application of an electric field."

Possible use of cadmium telluride for detection of pulsed x-rays in medical tomography is described in E. N. Arkad'eva et al, Sov. Phys. Tech. Phys. 26(9), September 1981, pp. 1122–1125. Arkad'eva et al state on pp. 1123–1124: "We used an M-P-M structure with osmium contacts as a detector based on these crystals. . . The current from the x-ray excitation (the photocurrent) at the detector may be written in the steady-state regime in the form $j=e\mu\Delta nE$, where e is the electronic charge, $\mu$ is the carrier mobility, E is the electric field, $\Delta n$ is the concentration of photocarriers created by the light, $\Delta n=\beta k \tau I$, where $\beta$ is the quantum yield ($\beta=1$), k is the absorption coefficient for x-rays in the transducer, $\tau$ is the carrier lifetime, and I is the radiation intensity."

FIG. 2 of Arkad'eva et al graphs x-ray absorption at various energies for cadmium telluride crystals of thickness 1 mm (curve 1) and 2 mm (curve 2).

FIG. 3 of Arkad'eva et al graphs dark current (curves 1 and 2) and photocurrent (curves 1' and 2') as a function of the voltage across the device in continuous wave operation.

A method of manufacture for a high-resistance n-type CdTe crystal is described in K. Zanio, et al, IEEE Trans. Nucl. Sci., NS21, 315, 1974.

A method for attaching contacts to the CdTe crystal is described in R. E. Braithwaite et al, Solid State Electron., 23, 1091, 1980.

A preferred method for producing p-type CdTe is described in E. Janik and R. Triboulet, "Ohmic contacts to p-type cadmium telluride and cadmium mercury telluride", J. Phys. D.: Appl. Phys., 16 (1983), 2333–2340.

A. Rose, in *Concepts in photoconductivity and allied problems*, Interscience Publishers, London, 1963, defines an Ohmic contact as follows (section 8.3): "An Ohmic contact is one that supplies a reservoir of carriers freely available to enter the semiconductor as needed."

The disclosures of all the above publications are hereby incorporated by reference.

SUMMARY OF THE INVENTION

The present invention seeks to provide an improved radiation detector.

There is thus provided in accordance with a preferred embodiment of the present invention a method for determining gamma ray photon energy including irradiating a high resistance n-type cadmium telluride alloy crystal with gamma ray photons, providing first and secohd electric contacts which are in electrical communication with the crystal, which are respectively negatively and positively biased and which provide free flow of electrons from the negatively biased contact to the crystal and wherein holes, generated by absorption of the photons in the crystal, recombine with the electrons, and determining the photon energy by measuring the amount of charge generated per photon absorbed by the crystal.

There is also provided in accordance with another preferred embodiment of the present invention a gamma ray photocurrent measuring method including irradiating a high resistance n-type cadmium telluride alloy crystal with gamma ray photons, providing first and second electrical contacts which are in electrical communication with the crystal, which are respectively negatively and positively biased, and which collect holes and electrons, respectively, from the crystal, wherein an electron enters the crystal from the negatively biased electrical contact each time an electron is collected by the positively biased electrical contact, and wherein the bias of electrical contact is high enough to ensure that the number of electrons collected at the contacts is higher than the number of electrons generated by the photons, and measuring photocurrent induced by absorption of the photons in the crystal.

There is additionally provided in accordance with another preferred embodiment of the present invention a gamma ray photocurrent measuring method including irradiating a high resistance p-type cadmium telluride alloy crystal with gamma ray photons, providing first and second electrical contacts which are in electrical communication with the crystal, which are respectively positively and negatively biased and which collect electrons and holes, respectively, from the crystal, wherein a hole enters the crystal from the positively biased electrical contact each time a hole is collected by the negatively biased electrical contact, and wherein the bias of electrical contact is high enough to ensure that the number of holes collected at the contacts is higher than the number of holes generated by the photons, and measuring photocurrent induced by absorption of the photons in the crystal.

There is further provided in accordance with another preferred embodiment of the present invention a method for determining x-ray photon energy including irradiating a high resistance n-type cadmium telluride alloy crystal with x-ray photons, providing first and second electrical contacts which are in electrical communication with the crystal, which are respectively negatively and positively biased and which provide free flow of electrons from the negatively biased contact to the crystal and wherein holes, generated by absorption of the photons in the crystal, recombine with the electrons, and determining the photon energy by measuring the amount of charge generated per photon absorbed by the crystal.

There is also provided in accordance with another preferred embodiment of the present invention an x-ray photocurrent measuring method including irradiating a high resistance n-type cadmium telluride alloy crystal with x-ray photons, providing first and second electrical contacts which are in electrical communication with the crystal, which are respectively negatively and positively biased, and which collect holes and electrons, respectively, from the crystal, wherein an electron enters the crystal from the negatively biased electrical contact each time an electron is collected by the positively biased electrical contact, and wherein the bias of electrical contact is high enough to ensure that the number of electrons collected at the contacts is higher than the number of electrons generated by the photons, and measuring photocurrent induced by absorption of the photons in the crystal.

There is additionally provided in accordance with another preferred embodiment of the present invention an x-ray photocurrent measuring method including irradiating a high resistance p-type cadmium telluride alloy crystal with x-ray photons, providing first and second electrical contacts which are in electrical communication with the crystal, which are respectively positively and negatively biased and which collect electrons and holes, respectively, from the crystal, wherein a hole enters the crystal from the positively biased electrical contact each time a hole is collected by the negatively biased electrical contact, and wherein the bias of electrical contact is high enough to ensure that the number of holes collected at the contacts is higher than the number of holes generated by the photons, and measuring photocurrent induced by absorption of the photons in the crystal.

Further in accordance with a preferred embodiment of the present invention the positively biased contact is selected to provide free flow of electrons from the crystal to the positively biased contact.

Still further in accordance with a preferred embodiment of the present invention the positively biased contact is selected so as to provide recombination of electrons in the crystal with holes, injected into the crystal by the positively biased electrical contact.

Still further in accordance with a preferred embodiment of the present invention the negatively biased contact is selected to provide free flow of holes from the crystal to the negatively biased contact.

Additionally in accordance with a preferred embodiment of the present invention the negatively biased contact is selected so as to provide recombination of holes in the crystal with electrons, injected into the crystal by the negatively biased electrical contact.

Further in accordance with a preferred embodiment of the present invention negatively biased contact is formed of one of the following group of materials: indium; cadmium; aluminum; gallium; alloys including one or more of indium, cadmium, aluminum and gallium.

Still further in accordance with a preferred embodiment of the present invention the negatively biased contact is formed of an n-type layer of conductive semiconductor.

Additionally in accordance with a preferred embodiment of the present invention the n-type conductive semiconductor contact includes one of the following group: n-type conductive CdTe; n-type conductive $Hg_xCd_{1-x}Te$ (0=<x=<1); n-type conductive HgTe; alloys of n-type conductive CdTe in which zinc partially replaces Cd; and alloys of n-type conductive CdTe in which selenium partially replaces Te.

Further in accordance with a preferred embodiment of the present invention wherein the positively biased contact is formed of one of the following group of materials: gold; platinum; copper; osmium; nickel; tellurium; carbon; and alloys including one or more of gold, platinum, copper, osmium, nickel and tellurium.

Still further in accordance with a preferred embodiment of the present invention the positively biased contact is formed of a p-type layer of conductive semiconductor.

Additionally in accordance with a preferred embodiment of the present invention the p-type conductive semiconductor contact includes one of the following group: p-type conductive CdTe; p-type conductive $Hg_xCd_{1-x}Te$ (0=<x=<1); p-type conductive HgTe; alloys of p-type conductive CdTe in which zinc partially replaces Cd; and alloys of p-type conductive CdTe in which selenium partially replaces Te.

Further in accordance with a preferred embodiment of the present invention the negatively biased contact is formed of one of the following group of materials: gold; platinum; copper; osmium; nickel; tellurium; carbon; and alloys including one or more of gold; platinum; copper; osmium; nickel and tellurium.

Still further in accordance with a preferred embodiment of the present invention the negatively biased contact is formed of a p-type conductive semiconductor.

Additionally in accordance with a preferred embodiment of the present invention the p-type conductive semiconductor contact includes one of the following group: p-type conductive CdTe; p-type conductive $Hg_xCd_{1-x}Te$ (0=<x=<1); p-type conductive HgTe; alloys of p-type conductive CdTe in which zinc partially replaces Cd; and alloys of p-type conductive CdTe in which selenium partially replaces Te.

Further in accordance with a preferred embodiment of the present invention the positively biased contact is formed of one of the following group of materials: indium; cadmium; aluminum; gallium; alloys including one or more of indium, cadmium, aluminum and gallium.

Further in accordance with a preferred embodiment of the present invention the positively biased contact is formed of an n-type conductive semiconductor.

Still further in accordance with a preferred embodiment of the present invention the n-type conductive semiconductor contact includes one of the following group: n-type conductive CdTe; n-type conductive $Hg_xCd_{1-x}Te$ (0=<x=<1); n-type conductive HgTe; alloys of n-type conductive CdTe in which zinc partially replaces Cd; and alloys of n-type conductive CdTe in which selenium partially replaces Te.

Yet further in accordance with a preferred embodiment of the present invention the n-type crystal is doped with one of the following elements: indium, gallium, aluminum, chlorine, bromine or iodine.

Additionally in accordance with a preferred embodiment of the present invention the p-type crystal is doped with one of the following elements: chlorine, bromine, iodine, copper, chromium or vanadium.

Additionally in accordance with a preferred embodiment of the present invention the cadmium telluride alloy crystal includes a cadmium telluride crystal.

Further in accordance with a preferred embodiment of the present invention the cadmium telluride alloy crystal includes a cadmium telluride alloy in which zinc partially replaces cadmium.

Still further in accordance with a preferred embodiment of the present invention the cadmium telluride alloy crystal includes a cadmium telluride alloy in which selenium partially replaces tellurium.

Additionally in accordance with a preferred embodiment of the present invention the system also includes a crystal equipped with a guard ring surrounding one of the contacts.

There is further provided in accordance with another preferred embodiment of the present invention a system for determining photon energy of a gamma ray source including a high resistance n-type cadmium telluride alloy crystal irradiated by the gamma ray source, first and second electrical contacts which are in electrical communication with the crystal, which are respectively negatively and positively biased and which provide free flow of electrons from the negatively biased contact to the crystal and wherein holes, generated by absorption of the photons in the crystal, recombine with the electrons, and photon energy measuring apparatus operative to measure the amount of charge generated per photon absorbed by the crystal.

There is also provided in accordance with a preferred embodiment of the present invention a system for measuring photocurrent induced by a gamma ray source including a high resistance n-type cadmium telluride alloy crystal irradiated by the gamma ray source, first and second electrical contacts which are in electrical communication with the crystal, which are respectively negatively and positively biased, which collect holes and electrons, respectively, from the crystal, which cause an electron to enter the crystal from the negatively biased electrical contact each time an electron is collected by the positively biased electrical contact, and wherein the bias of electrical contact is high enough to ensure that the number of electrons collected at the contacts is higher than the number of electrons generated by the photons, and photocurrent measuring apparatus operative to measure photocurrent induced by absorption of the photons in the crystal.

There is additionally provided in accordance with a preferred embodiment of the present invention a system for measuring photocurrent induced by a gamma ray source including a high resistance p-type cadmium telluride alloy crystal irradiated by the gamma ray source, first and second electrical contacts which are in electrical communication with the crystal, which are respectively positively and negatively biased, which collect electrons and holes, respectively, from the crystal, and which cause a hole to enter the crystal from the positively biased electrical contact each time a hole is collected by the negatively biased electrical contact, and wherein the bias of electrical contact is high enough to ensure that the number of holes collected at the contacts is higher than the number of holes generated by the photons, and photocurrent measuring apparatus operative to measure photocurrent induced by absorption of the photons in the crystal.

There is further provided in accordance with another preferred embodiment of the present invention a system for determining the photon energy of an x-ray source including a high resistance n-type cadmium telluride alloy crystal irradiated by the x-ray source, first and second electrical contacts which are in electrical communication with the crystal, which are respectively negatively and positively biased and which provide free flow of electrons from the negatively biased contact to the crystal and wherein holes, generated by absorption of the photons in the crystal, recombine with the electrons, and photon energy measuring apparatus operative to measure the amount of charge generated per photon absorbed by the crystal.

There is also provided in accordance with a preferred embodiment of the present invention a system for measuring photocurrent induced by an x-ray source including a high resistance n-type cadmium telluride alloy crystal irradiated by the x-ray photons, first and second electrical contacts which are in electrical communication with the crystal, which are respectively negatively and positively biased, which collect holes and electrons, respectively, from the crystal, and which cause an electron to enter the crystal from the negatively biased electrical contact each time an electron is collected by the positively biased electrical contact, and wherein the bias of electrical contact is high enough to ensure that the number of electrons collected at the contacts is higher than the number of electrons generated by the photons, and photocurrent measuring apparatus operative to measure photocurrent induced by absorption of the photons in the crystal.

There is additionally provided in accordance with a preferred embodiment of the present invention a system for measuring photocurrent induced by an x-ray source including a high resistance p-type cadmium telluride alloy crystal irradiated by the x-ray source, first and second electrical contacts which are in electrical communication with the crystal, which are respectively positively and negatively biased, which collect electrons and holes, respectively, from the crystal, and which cause a hole to enter the crystal from the positively biased electrical contact each time a hole is collected by the negatively biased electrical contact, and wherein the bias of electrical contact is high enough to ensure that the number of holes collected at the contacts is higher than the number of holes generated by the photons, and photocurrent measuring apparatus operative to measure photocurrent induced by absorption of the photons in the crystal.

BRIEF DESCRIPTION OF THE DRAWINGS

The present invention will be understood and appreciated from the following detailed description, taken in conjunction with the drawings in which.

DETAILED DESCRIPTION OF PREFERRED EMBODIMENTS

Figure 1:
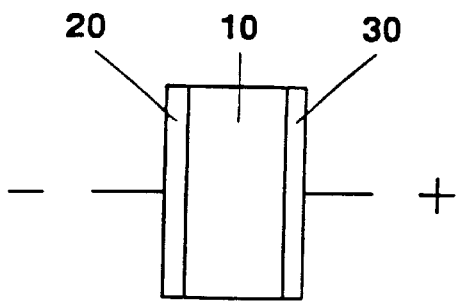
FIG. 1 is a simplified front view illustration of an x-ray or gamma ray detector constructed and operative in accordance with one preferred embodiment of the present invention.
Figure 2:
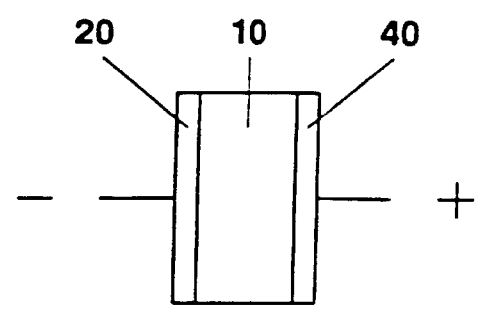
FIG. 2 is a simplified front view illustration of an x-ray or gamma ray detector constructed and operative in accordance with another preferred embodiment of the present invention.

Reference is now made to FIGS. 1 and 2 which are simplified illustrations of an x-ray or gamma ray detector constructed and operative in accordance with two respective alternative embodiments of the present invention.

The x-ray or gamma ray detectors of FIGS. 1 and 2 may be constructed by the following method:

a. Provide a CdTe crystal 10, preferably a high-resistance indium-doped n-type CdTe crystal which may be manufactured in accordance with conventional methods such as that described in K. Zanio et al, IEEE Trans. Nucl. Sci., NS21, 315, 1974 b. Attach contacts to the CdTe crystal, using conventional methods such as the method described in R. E. Braithwaite et al, Solid State Electron., 23, 1091, 1980. According to one preferred embodiment of the present invention, as illustrated in FIG. 1, the contacts comprise a negatively biased contact 20 which provides free entrance of electrons into the crystal, and a positively biased contact 30 which provides free exit of electrons from the crystal. The contacts 20 and 30 may, for example, be formed by deposition of indium on the crystal 10.

According to an alternative embodiment of the present invention, the CdTe crystal 10 may comprise a high-resistance chlorine-doped p-type CdTe crystal which is manufactured in accordance with conventional methods such as that described in B. Biglari et al, Phys. Stat. Sol. (a)100, pp. 589–596, 1987. In this embodiment, the positively biased contact 30 provides free entrance of holes into the crystal and the negatively biased contact 20 provides free exit of holes from the crystal. The contacts 20 and 30 may, in this embodiment, be formed by deposition of a thin layer of conductive p-type CdTe on the crystal 10.

An alternative to the detector of FIG. 1 is illustrated in FIG. 2, in which the negatively biased contact 20 provides free entrance of electrons into a high resistance n-type CdTe crystal 10 and a positively biased contact 40 provides free entrance of holes into the crystal. The negatively biased contact 20 may, for example, be formed by deposition of indium on the crystal 10. The positively biased contact 40 may, for example, be formed of a thin layer of conductive p-type CdTe deposited on the crystal 10.

According to an alternative implementation of FIG. 2, the positively biased contact 40 provides free entrance of holes into the high resistance p type crystal and the negatively biased contact 20 provides free entrance of electrons into a p-type crystal. The positively biased contact 40 may, for example, be formed by deposition of a thin layer of conductive p-type CdTe on the crystal 10. The negatively biased contact 20 may, for example, be formed of indium deposited on the crystal.

Figure 3:
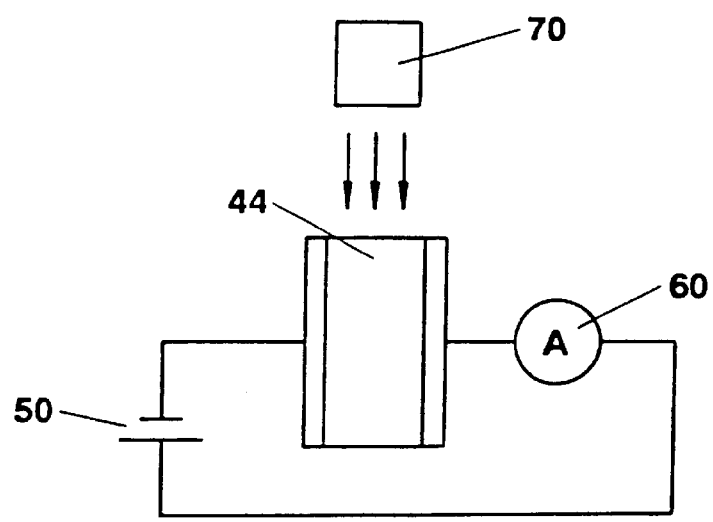
FIG. 3 is a simplified diagram of a preferred system for measuring a photocurrent induced by x-rays or gamma rays.

Reference is now made to FIG. 3 which is a simplified diagram of a preferred system for measuring a photocurrent induced by x-rays or gamma rays. The system of FIG. 3 preferably includes a detector 44 which may be based on the detectors of FIGS. 1 and 2, connected to a voltage bias source 50 such as a battery or power supply, an electrical current measurement device 60 such as an ammeter and a radiation source 70 which may comprise an x-ray tube which irradiates an object to be inspected, or alternatively a gamma source such as a gamma radioactive material.

Preferably, the mode of operation of the system of FIG. 3 is as follows:

a. The CdTe crystal is irradiated by a flux of x-ray photons or gamma ray photons.

b. As each photon is absorbed by the CdTe crystal, it generates equal numbers of electrons and holes. These electrons and holes flow in opposite directions, under the influence of the bias voltage applied to the detector contacts 20 and 30. The electrons flow toward the positive contact whereas the holes flow toward the negative contact.

In the detector of FIG. 1, if the crystal is an n-type crystal, an electron reaching the positive contact leaves the crystal by entering the contact. In the detector of FIG. 2, an electron reaching the positive contact disappears by recombination with a hole injected into the crystal by the positive contact.

If the crystal is a p-type crystal, then, in the detector of FIG. 1, a hole reaching the negative contact leaves the crystal by entering the contact. In the detector of FIG. 2, a hole reaching the negative contact disappears by recombination with an electron injected into the crystal by the negative contact.

c. This flow of electrons and holes results in an electric current measured by the ammeter 60. According to the general theory of photoconductivity, this current continues, as more electrons or holes are free to enter the crystal through the negative or positive contact, respectively, and leave it through the positive or negative contact, respectively, until electrons and holes disappear in pairs within the crystal by electron hole recombination.

The electron or hole transition time through the crystal is inversely proportional to the bias voltage. Therefore, application of a sufficiently high bias voltage causes the transition time to become shorter than the electron or hole recombination time. The photocurrent includes both electrons and holes originally generated by the photons, and electrons or holes entering the crystal through the contacts. Whenever the transition time is shorter than the recombination time, the photocurrent is significantly amplified (current gain) compared to the current due only to the electrons and holes originally generated by the photons.

For example, for a detector having a 1.5 mm distance between the contacts, and a bias voltage of 200 V, amplification by a factor of 250 may be obtained, relative to the signal obtained with a conventional detector which is similar in every respect except that the contacts are blocking.

As described above, the contacts allow free charge flow into and out of the crystal so that the dark current in the detector shown and described herein is high compared to conventional CdTe detectors equipped with blocking contacts. However, since the current gain is also high in the detector shown and described herein, relative to a conventional detector, the signal-to-dark current ratio is comparable to or better than that of a conventional detector.

A further advantage of the system of FIG. 3 is that the current is not affected by hole trapping within the crystal, in contrast to conventional detectors.

Figure 4:
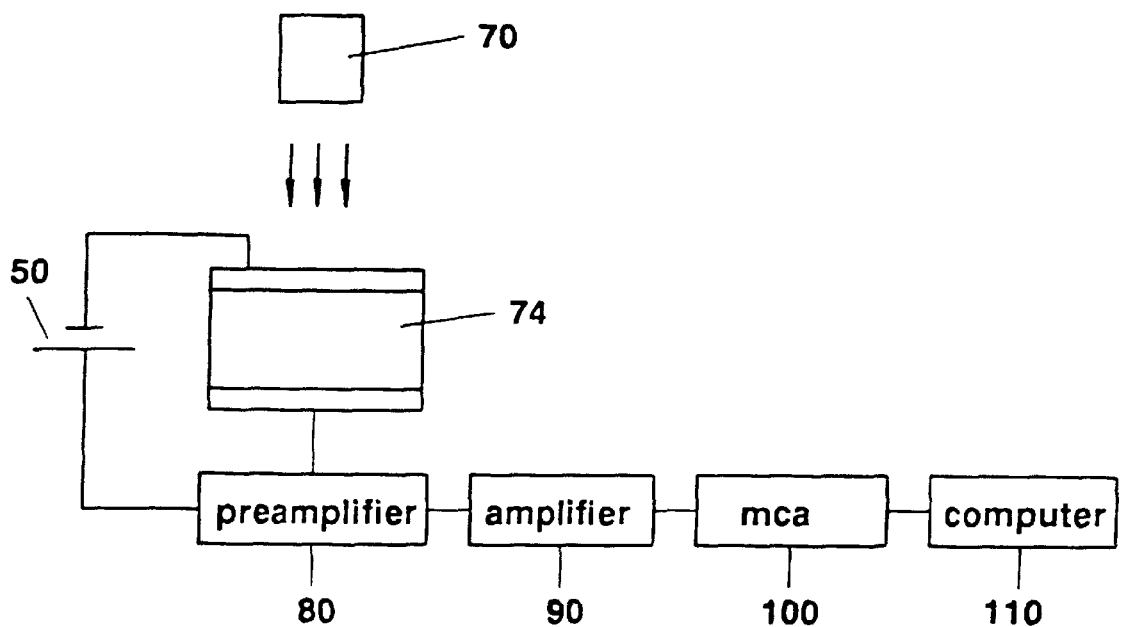
FIG. 4 is a simplified block diagram of preferred spectroscopy apparatus constructed and operative in accordance with a preferred embodiment of the present invention.

Reference is now made to FIG. 4 which is a simplified block diagram of preferred spectroscopy system constructed and operative in accordance with a preferred embodiment of the present invention in which the charge generated by individual x-ray photons or gamma ray photons is measured.

The system of FIG. 4 preferably includes the following components:

a. A source 70 of x-ray or gamma rays. For example, the source may comprise an x-ray source such as an x-ray tube which irradiates an object to be inspected. Alternatively, the source may comprise an object to be inspected which incorporates within it a radioactive source, such as a patient to whom a drug containing a radioactive source has been administered.

b. An x-ray or gamma ray detector 74 which may be based on the detectors of FIGS. 1 or 2;

c. A voltage bias source 50 such as a battery or a power supply;

d. A preamplifier 80 such as an EG&G ORTEC model number 142A;

e. A spectroscopy amplifier 90, such as an EG&G ORTEC model number 572;

f. A multi-channel analyzer (MCA) 100 such as an EG&G ORTEC model number 916; and g. A computer 110 such as an IBM AT 286.

Units 80, 90, 100 and 110 are commercially available as a single module, namely the Gamma Spectroscopy System, marketed by EG&G ORTEC.

Preferably, the mode of operation of the system of FIG. 4 is as follows:

a. The CdTe detector is irradiated by a flux of x-ray photons or gamma ray photons.

b. As a single photon is absorbed by the CdTe crystal, it generates equal numbers of electrons and holes. These electrons and holes flow in opposite directions, under the influence of the bias voltage applied to the detector contacts 20 and 30. The electrons flow toward the positive contact whereas the holes flow toward the negative contact.

If the crystal is an n-type crystal, then, in the detector of FIG. 1, an electron reaching the positive contact leaves the crystal by entering the contact. In the detector of FIG. 2, an electron reaching the positive contact disappears by recombination with a hole injected into the crystal by the positive contact.

Simultaneously with the above-described electron and hole flow, other electrons enter the crystal from the negative contact and flow toward the holes.

The flow terminates when all the electrons and holes disappear from the crystal either by exiting through the contacts, or by electron hole recombination within the crystal.

The spectroscopy system of FIG. 4 measures the charge collected from each single photon absorbed by the detector, and provides the statistical distribution of charges of all the photons absorbed by the detector.

In the present invention, holes recombine with electrons arriving from the negative contact. In contrast, in conventional CdTe detectors, holes must flow all the way toward the negative contact. Since electron flow is faster than hole flow, the time required for complete charge collection in the detector of FIGS. 1 or 2 is shorter than in conventional CdTe detectors.

Due to the shorter charge collection time provided by the method of the present invention, spectroscopic measurements may be carried out by the system of FIG. 4 with a higher signal-to-noise ratio and/or at higher photon flux rates, compared to conventional CdTe detectors.

A further advantage of the system of FIG. 4 is that the detector is not adversely affected by hole trapping within the crystal.

Suitable materials for use in the spectroscopy system of FIG. 4 include the following high resistance n-type crystals:

a. cadmium telluride;

b. Alloys thereof in which an additional material such as zinc replaces a certain percentage of the cadmium ($Cd_{1-x}Zn_xTe$ where $0<=x<=1$).

c. Alloys thereof in which an additional material such as selenium replaces a certain percentage of the tellurium ($CdTe_{1-x}Se_x$ where $0<=x<=1$).

d. Combinations of a, b and c.

The n-type crystal may be doped with materials such as: indium, gallium, aluminum, chlorine, bromine or iodine.

Contacts providing free flow of electrons to and from the crystals, for use in the spectroscopy system of FIG. 4 may be formed of indium, cadmium, aluminum, gallium, and alloys including these materials. Also, any n-type conductive semiconductor may be employed such as n-type conductive CdTe, n-type conductive CdS, n-type conductive ZnSe, and n-type conductive $Hg_xCd_{1-x}Te$ ($0=<x=<1$).

Contacts providing free flow of holes to the crystals, for use in the spectroscopy system of FIG. 4 may, for example, be formed of gold, platinum, copper, osmium, nickel, tellurium, antimony, carbon, and alloys including these materials, as well as p-type conductive semiconductors such as p-type conductive CdTe or p-type conductive $Hg_xCd_{1-x}Te$ ($0=<x=<1$). or p-type conductive HgTe.

A preferred method for producing p-type HgTe is described in E. Janik and R. Triboulet, "Ohmic contacts to p-type cadmium telluride and cadmium mercury telluride", J. Phys. D.: Appl. Phys., 16 (1983), 2333–2340.

Suitable crystals for use in the photocurrent measurement system of FIG. 3 include the crystals described above as suitable for the embodiment of FIG. 4 and, additionally, similar crystals which are high-resistant p-type instead of n-type.

The p-type crystal may be doped with materials such as: chlorine, bromine, iodine, copper, chromium or vanadium.

Contacts providing free flow of electrons to p-type crystals, for use in the photocurrent measurement system of FIG. 3 may be the same as the contacts, described above with reference to FIG. 4, which provide free flow of electrons to and from n-type crystals.

Contacts providing free flow of holes to and from p-type crystals, for use in the photocurrent measurement system of FIG. 3 may, for example, be the same as the contacts, described above with reference to FIG. 4, which provide free flow of holes into n-type crystals.

The operation of detectors made of p-type crystals is generally the same as the operation of detectors having n-type crystals, as described above with reference to FIG. 3, except that the major electric current carriers are holes rather than electrons.

Figure 5:
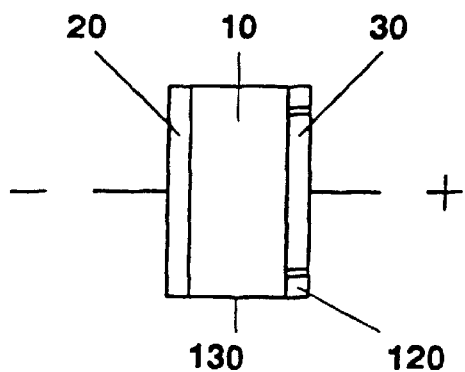
FIG. 5 is a front view illustration of a detector which is a variation of the detectors of FIG. 1 or FIG. 2 in that the positive contact is surrounded by a guard ring contact.
Figure 6:
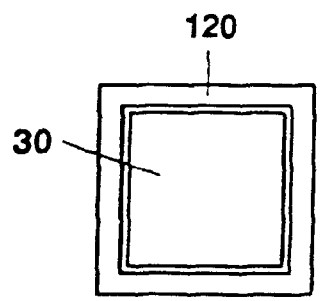
FIG. 6 is a side view illustration of the detector of FIG. 5.

According to a preferred embodiment of the present invention, as illustrated in FIGS. 5 and 6, a guard ring 120 is provided which surrounds at least one of the contacts, such as the positive contact 30 (FIG. 1) or 40 (FIG. 2). The guard ring reduces deterioration of the detector's performance due to the influence of the detector's side walls 130. The guard ring may be identical in configuration and as to material to the positive contact 30. The embodiment of FIGS. 5 and 6 is suitable for the spectroscopy application of FIG. 4.

One preferred method for fabricating the positive contact and the guard ring is as follows:

a. Fabricate the positive contact;

b. Using photolithographic techniques, separating a guard ring out of the positive contact.

In the present specification and claims, the term "cadmium telluride" or "CdTe" is used to refer either to undopedCdTe or, preferably, to doped CdTe.

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

It will be appreciated by persons skilled in the art that the present invention is not limited to what has been particularly shown and described hereinabove. Rather, the scope of the present invention is defined only by the claims that follow:

We claim:

1. A method for determining the energy of a photon of ionizing radiation comprising:

irradiating a high resistance n-type cadmium telluride alloy crystal with photons of ionizing radiation;

providing first and second electrical contacts which are in electrical communication with the crystal, which are respectively negatively and positively biased and which provide free flow of electrons from the negatively biased contact to the crystal and wherein holes, generated by absorption of the photons in the crystal, recombine with said electrons; and determining the photon energy by measuring the amount of charge generated per photon absorbed by the crystal.

2. A method according to claim 1 wherein the positively biased contact is selected to provide free flow of electrons from the crystal to the positively biased contact.

3. A method according to claim 2 wherein the positively biased contact is formed of one of the following group of materials: indium; cadmium; aluminum; gallium; alloys including one or more of indium, cadmium, aluminum and gallium.

4. A method according to claim 2 wherein the positively biased contact is formed of an n-type conductive semiconductor.

5. A method according to claim 4 wherein the n-type conductive semiconductor contact comprises one of the following group: n-type conductive CdTe; n-type conductive $Hg_xCd_{1-x}Te$ ($0=<x=<1$); n-type conductive HgTe; alloys of n-type conductive CdTe in which zinc partially replaces Cd; and alloys of n-type conductive CdTe in which selenium partially replaces Te.

6. A method according to claim 1 wherein the positively biased contact is selected so as to provide recombination of electrons in the crystal with holes, injected into the crystal by the positively biased electrical contact.

7. A method according to claim 6 wherein the positively biased contact is formed of one of the following group of materials:

gold; platinum; copper; osmium; nickel; tellurium; carbon; antimony; and alloys including one or more of gold, platinum, copper, osmium, nickel, antimony, carbon and tellurium.

8. A method according to claim 6 wherein the positively biased contact is formed of a p-type layer of conductive semiconductor.

9. A method according to claim 8 wherein the p-type conductive semiconductor contact comprises one of the following group: p-type conductive CdTe; p-type conductive $Hg_xCd_{1-x}Te$ ($0=<x=<1$); p-type conductive HgTe; alloys of p-type conductive CdTe in which zinc partially replaces Cd; and alloys of p-type conductive CdTe in which selenium partially replaces Te.

10. A system according to claim 1 wherein the negatively biased contact is formed of one of the following group of materials: indium; cadmium; aluminum; gallium; alloys including one or more of indium, cadmium, aluminum and gallium.

11. A method according to claim 1 wherein the negatively biased contact is formed of an n-type layer of conductive semiconductor.

12. A method according to claim 11 wherein the n-type conductive semiconductor contact comprises one of the following group: n-type conductive CdTe; n-type conductive $Hg_xCd_{1-x}Te$ ($0=<x=<1$); n-type conductive HgTe; alloys of n-type conductive CdTe in which zinc partially replaces Cd; and alloys of n-type conductive CdTe in which selenium partially replaces Te.

13. A method according to claim 1 wherein said n-type crystal is doped with one of the following elements: indium, gallium, aluminum, chlorine, bromine or iodine.

14. A method according to claim 1 wherein the cadmium telluride alloy crystal comprises a cadmium telluride crystal.

15. A method according to claim 1 wherein the cadmium telluride alloy crystal comprises a cadmium telluride alloy in which zinc partially replaces cadmium.

16. A method according to claim 1 wherein the cadmium telluride alloy crystal comprises a cadmium telluride alloy in which selenium partially replaces tellurium.

17. A method according to claim 1 also comprising a crystal equipped with a guard ring surrounding one of the contacts.

18. A method according to claim 1 wherein said ionizing radiation is gamma ray radiation.

19. A method according to claim 1 and wherein said ionizing radiation is X-ray radiation.

20. An ionizing radiation induced photocurrent measuring method comprising:

irradiating a high resistance n-type cadmium telluride alloy crystal with photon flux of ionizing radiation;

providing first and second electrical contacts which are in electrical communication with crystal, which are respectively negatively and positively biased, and which collect holes and electrons, respectively, from the crystal, wherein an electron enters the crystal from the negatively biased electrical contact each time an electron is collected by the positively biased electrical contact, and wherein the bias of electrical contact is high enough t o ensure that the number of electrons collected at the contact is higher than the number of electrons generated by the photon; and measuring photocurrent induced by absorption of the photons in the crystal.

21. A method according to claim 20 wherein the positively biased contact is selected to provide free flow of electrons from the crystal to the positively biased contact.

22. A method according to claim 21 wherein the positively biased contact is formed of one of the following group of materials: indium; cadmium; aluminum; gallium; alloys including one or more of indium, cadmium aluminum and gallium.

23. A method according to claim 21 wherein the positively biased contact is formed of an n-type conductive semiconductor.

24. A method according to claim 23 wherein the n-type conductive semiconductor contact comprises one of the following group: n-type conductive CdTe; n-type conductive $Hg_xCd_{1-x}Te$ ($0=<x=<1$); n-type conductive HgTe; alloys of n-type conductive CdTe in which zinc partially replaces Cd; and alloys of n-type conductive CdTe in which selenium partially replaces Te.

25. A method according to claim 20 wherein the positively biased contact is selected so as to provide recombination of electrons in the crystal with holes, injected into the crystal by the positively biased electrical contact.

26. A method according to claim 25 wherein the positively biased contact is formed of one of the following group of materials:

gold; platinum; copper; osmium; nickel; tellurium; carbon; antimony; and alloys including one or more of gold, platinum, copper, osmium, nickel, antimony, carbon, and tellurium.

27. A method according to claim 25 wherein the positively biased contact is formed of a p-type layer of conductive semiconductor.

28. A method according to claim 27 wherein the p-type conductive semiconductor contact comprises one of the following group: p-type conductive CdTe; p-type conductive $Hg_xCd_{1-x}Te$ ($0=<x=<1$); p-type conductive HgTe; alloys of p-type conductive CdTe in which zinc partially replaces Cd; and alloys of p-type conductive CdTe in which selenium partially replaces Te.

29. A system according to claim 20 wherein the negatively biased contact is formed of one of the following group of materials: indium; cadmium; aluminum; gallium; alloys including one or more of indium, cadmium, aluminum and gallium.

30. A method according to claim 20 wherein the negatively biased contact is formed of an n-type layer of conductive semiconductor.

31. A method according to claim 30 wherein the n-type conductive semiconductor contact comprises one of the following group: n-type conductive CdTe; n-type conductive $Hg_xCd_{1-x}Te$ (0=<x=<1); n-type conductive HgTe; alloys of n-type conductive CdTe in which zinc partially replaces Cd; and alloys of n-type conductive CdTe in which selenium partially replaces Te.

32. A method according to claim 20 wherein said n-type crystal is doped with one of the following elements: indium, gallium, aluminum, chlorine, bromine or iodine.

33. A method according to claim 20 wherein the cadmium telluride alloy crystal comprises cadmium telluride crystal.

34. A method according to claim 20 wherein the cadmium telluride alloy crystal comprises a cadmium telluride alloy in which zinc partially replaces cadmium.

35. A method according to claim 20 wherein the cadmium telluride alloy crystal comprises a cadmium telluride alloy in which selenium partially replaces tellurium.

36. A method according to claim 20 and also comprising a crystal equipped with a guard ring surrounding one of the contacts.

37. A method according to claim 20 and wherein said ionizing radiation is gamma ray radiation.

38. A method according to claim 20 and wherein said ionizing radiation is X-ray radiation.

39. An ionizing radiation induced photocurrent measuring method comprising:
    irradiating a high resistance p-type cadmium telluride alloy crystal with a photon flux of ionizing radiation;
    providing first and second electrical contact s which are in electrical communication with the crystal, which are respectively positively and negatively biased and which collect electrons and holes, respectively, from the crystal,
    wherein a hole enters the crystal from the positively biased electrical contact each time a hole is collected by the negatively biased electrical contact, and
    wherein the bias of electrical contact is high enough to ensure that the number of holes collected at the contacts is higher than the number of holes generated by the photons; and
    measuring photocurrent induced by absorption of the photons in the crystal.

40. A method according to claim 39 wherein the negatively biased contact is selected to provide free flow of holes from the crystal to the negatively biased contact.

41. A method according to claim 40 wherein the negatively biased contact is formed of one of the following group of materials: gold; platinum; copper; osmium; nickel; tellurium; carbon; and alloys including on or more of gold; platinum; copper; osmium; nickel and tellurium.

42. A method according to claim 40 wherein the negatively biased contact is formed of a p-type conductive semiconductor.

43. A method according to claim 42 wherein the p-type conductive semiconductor contact comprises one of the following group: p-type conductive CdTe; p-type conductive $Hg_xCd_{1-x}Te$ (0=<x=<1); p-type conductive HgTe; alloys of p-type conductive CdTe in which zinc partially replaces Cd; and alloys of p-type conductive CdTe in which selenium partially replaces Te.

44. A method according to claim 39 wherein the negatively biased contact is selected so as to provide recombination of holes in the crystal with electrons, injected into the crystal by the negatively biased electrical contact.

45. A system according to claim 44 wherein the negatively biased contact is formed of one of the following group of materials: indium; cadmium; aluminum; gallium; alloys including one or more of indium, cadmium, aluminum and gallium.

46. A method according to claim 44 wherein the negatively biased contact is formed of an n-type layer of conductive semiconductor.

47. A method according to claim 46 wherein the n-type conductive semiconductor contact comprises one of the following group: n-type conductive CdTe; n-type conductive $Hg_xCd_{1-x}Te$ (0=<x=<1); n-type conductive HgTe; alloys of n-type conductive CdTe in which zinc partially replaces Cd; and alloys of n-type conductive CdTe in which selenium partially replaces Te.

48. A method according to claim 39 wherein the positively biased contact is formed of one of the following group of materials:
    gold; platinum; copper; osmium; nickel; tellurium; carbon; antimony; and alloys including one or more of gold, platinum, copper, osmium, nickel, antimony, carbon and tellurium.

49. A method according to claim 39 wherein the positively biased contact is formed of a p-type layer of conductive semiconductor.

50. A method according to claim 49 wherein the p-type conductive semiconductor contact comprises one of the following group: p-type conductive CdTe; p-type conductive $Hg_xCd_{1-x}Te$ (0=<x=<1); p-type conductive HgTe; alloys of p-type conductive CdTe in which zinc partially replaces Cd; and alloys of p-type conductive CdTe in which selenium partially replaces Te.

51. A method according to claim 37 wherein said p-type crystal is doped with one of the following elements: chlorine, bromine, iodine, copper, chromium or vanadium.

52. A method according to claim 39 wherein the cadmium telluride alloy crystal comprises a cadmium telluride crystal.

53. A method according to claim 39 wherein the cadmium telluride alloy crystal comprises a cadmium telluride alloy in which zinc partially replaces cadmium.

54. A method according to claim 39 wherein the cadmium telluride alloy crystal comprises telluride alloy in which selenium partially replaces tellurium.

55. A method according to claim 39 and also comprising a crystal equipped with a guard ring surrounding one of the contacts.

56. A method according to claim 39 and wherein said ionizing radiation is gamma ray radiation.

57. A method according to claim 39 and wherein said ionizing radiation is X-ray radiation.

58. A system for determining photon energy of a gamma ray source comprising:
    a high resistance n-type cadmium telluride alloy crystal irradiated by the gamma ray source;
    first and second electrical contacts which are in electrical communication with the crystal, which are respectively negatively and positively biased and which provide free flow of electrons from the negatively biased contact to the crystal and wherein holes, generated by absorption of the photons in crystal, recombine with said electrons; and photon energy measuring apparatus operative to measure the amount of charge generated per photon absorbed by the crystal.

59. A system according to claim 58 and wherein said photon energy measuring apparatus operative to measure the amount of charge generated per photon absorbed by said crystal provides the statistical distribution of charges of all the photons absorbed by the detector without being adversely affected by hole trapping within said crystal.

60. A system for measuring photocurrent induced by a gamma ray source comprising:

a high resistance n-type cadmium telluride alloy crystal irradiated by the gamma ray source;

first and second electrical contacts which are in electrical communication with the crystal, which are respectively negatively and positively biased, which collect holes and electron, respectively, from the crystal, which cause an electron to enter the crystal from the negatively biased electrical contact each time an electron is collected by the positively biased electrical contact, and wherein the bias of electrical contact is high enough to ensure that the number of electrons collected at the contacts is higher than the number of electrons generated by the photons; and photocurrent measuring apparatus operative to measure photocurrent induced by absorption of the photons in the crystal.

61. A system for measuring photocurrent induced by a gamma ray source comprising:

a high resistance p-type cadmium telluride alloy crystal irradiated by the gamma ray source;

first and second electrical contacts which are in electrical communication with the crystal, which are respectively positively and negatively biased, which collect electrons and holes, respectively, from the crystal, and which cause a hole to enter the crystal from the positively biased electrical contact each time a hole is collected by the negatively biased electrical contact, and wherein the bias of electrical contact is high enough to ensure that the number of holes collected at the contacts is higher than the number of holes generated by the photons; and photocurrent measuring apparatus operative to measure photocurrent induced by absorption of the photons in the crystal.

62. A system for determining the photon energy of an x-ray source comprising:

a high resistance n-type cadmium telluride alloy crystal irradiated by the x-ray source;

first and second electrical contacts which are in electrical communication with the crystal, which are respectively negatively and positively biased and which provide free flow of electrons from the negatively biased contact to the crystal and wherein holes, generated by absorption of the photons in the crystal, recombine with said electrons; and photon energy measuring apparatus operative to measure the amount of charge generated per photon absorbed by crystal.

63. A system according to claim 62 and wherein said photon energy measuring apparatus operative to measure the amount of charge generated per photon absorbed by said crystal provides the statistical distribution of charoes of all the photons absorbed by the detector without being adversely affected by hole trapping within said crystal.

64. A system for measuring photocurrent induced by an x-ray source comprising:

a high resistance n-type cadmium telluride alloy crystal irradiated by the x-ray photons;

first and second electrical contacts which are in electrical communication with the crystal, which are respectively negatively and positively biased, which collect holes and electrons, respectively, from the crystal, and which cause an electron to enter the crystal from the negatively biased electrical contact each time an electron is collected by the positively biased electrical contact, and wherein the bias of electrical contact is high enough to ensure that the number of electrons collected at the contact is higher than the number of electrons generated by the photons; and photocurrent measuring apparatus operative to measure photocurrent induced by absorption of the photons in the crystal.

65. A system for measuring photocurrent induced by an x-ray source comprising:

a high resistance p-type cadmium telluride alloy crystal irradiated by the x-ray source;

first and second electrical contacts which are in electrical communication with the crystal, which are respectively positively and negatively biased, which collect electrons and holes, respectively, from the crystal, and which cause a hole to enter the crystal from the positively biased electrical contact each time a hole is collected by the negatively biased electrical contact, and wherein the bias of electrical contact is high enough to ensure that the number of holes collected at the contacts is higher than the number of holes generated by the photons; and photocurrent measuring apparatus operative to measure photocurrent induced by absorption of the photons in the crystal.

* * * * *